(12) United States Patent
Greenwood

(10) Patent No.: US 8,936,953 B2
(45) Date of Patent: Jan. 20, 2015

(54) LIGHT EMITTING DIODE THERMALLY ENHANCED CAVITY PACKAGE AND METHOD OF MANUFACTURE

(71) Applicant: Micron Technology, Inc., Boise, ID (US)

(72) Inventor: Jonathon G. Greenwood, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/095,017

(22) Filed: Dec. 3, 2013

(65) Prior Publication Data

US 2014/0093989 A1  Apr. 3, 2014

Related U.S. Application Data

(62) Division of application No. 12/750,426, filed on Mar. 30, 2010, now Pat. No. 8,598,612.

(51) Int. Cl.
| | |
|---|---|
| *H01L 21/00* | (2006.01) |
| *H01L 33/60* | (2010.01) |
| *H01L 33/64* | (2010.01) |
| *H01L 25/16* | (2006.01) |
| *H01L 33/48* | (2010.01) |

(52) U.S. Cl.
CPC ............. *H01L 33/60* (2013.01); *H01L 33/647* (2013.01); *H01L 25/167* (2013.01); *H01L 33/486* (2013.01); *H01L 2933/0033* (2013.01); *H01L 2224/48091* (2013.01); *H01L 2224/48247* (2013.01)
USPC .................................. 438/26; 438/24; 438/33

(58) Field of Classification Search
USPC ..................................... 438/24, 26, 33; 257/99
See application file for complete search history.

(56) References Cited

U.S. PATENT DOCUMENTS

| | | |
|---|---|---|
| 6,964,877 B2 | 11/2005 | Chen et al. |
| 7,262,440 B2 | 8/2007 | Choi et al. |
| 7,521,724 B2 | 4/2009 | Chen et al. |
| 2006/0054912 A1 | 3/2006 | Murakami et al. |
| 2006/0091788 A1 | 5/2006 | Yan |
| 2006/0220048 A1 | 10/2006 | Matsumoto et al. |
| 2007/0228386 A1 | 10/2007 | Shie et al. |
| 2008/0048201 A1 | 2/2008 | Kim et al. |
| 2009/0029494 A1 | 1/2009 | Tseng et al. |
| 2009/0206358 A1* | 8/2009 | Chen et al. ............. 257/99 |
| 2009/0284932 A1 | 11/2009 | Lin |
| 2009/0294793 A1* | 12/2009 | Kim et al. ............. 257/99 |
| 2010/0230710 A1 | 9/2010 | Kim |
| 2011/0241041 A1 | 10/2011 | Greenwood |

OTHER PUBLICATIONS

Feezell, D.F. et al., Development of Nonpolar and Semipolar InGaN/GaN Visible Light-Emitting Diodes, MRS Bulletin, vol. 34, pp. 318-323, May 2009.

\* cited by examiner

*Primary Examiner* — Daniel Whalen
(74) *Attorney, Agent, or Firm* — Perkins Coie LLP

(57) ABSTRACT

Several embodiments of light emitting diode packaging configurations including a substrate with a cavity are disclosed herein. In one embodiment, a cavity is formed on a substrate to contain an LED and phosphor layer. The substrate has a channel separating the substrate into a first portion containing the cavity and a second portion. A filler of encapsulant material or other electrically insulating material is molded in the channel. The first portion can serve as a cathode for the LED and the second portion can serve as the anode.

19 Claims, 5 Drawing Sheets

LIGHT EMITTING DIODE THERMALLY ENHANCED CAVITY PACKAGE AND METHOD OF MANUFACTURE

CROSS-REFERENCE TO RELATED APPLICATION

The present application is a divisional of U.S. application Ser. No. 12/750,426 filed Mar. 30, 2010, now U.S. Pat. No. 8,598,612, which is incorporated herein by reference.

TECHNICAL FIELD

The present disclosure is related to solid state lighting (SSL) devices and associated methods of operation and manufacture. In particular, the present disclosure is related to light emitting diodes (LEDs) and associated methods of packaging.

BACKGROUND

Mobile phones, personal digital assistants (PDAs), digital cameras, MP3 players, and other portable electronic devices utilize SSL devices (e.g., white light LEDs) for background illumination. However, true white light LEDs are not available because LEDs typically only emit light at one particular wavelength. For human eyes to perceive the color white, a mixture of wavelengths is needed.

One conventional technique for emulating white light with LEDs includes depositing a converter material (e.g., a phosphor) on a light emitting material. For example, as shown in FIG. 1A, a conventional LED device 10 includes a support 2 carrying an LED die 4 and a converter material 6 deposited on the LED die 4. The LED die 4 can include one or more light emitting components. For example, as shown in FIG. 1B, the LED die 4 can include a silicon substrate 12, N-type gallium nitride (GaN) material 14, an indium gallium nitride (InGaN) material 16 (and/or GaN multiple quantum wells), and a P-type GaN material 18 on one another in series. The LED die 4 can also include a first contact 20 on the P-type GaN material 18 and a second contact 22 on the N-type GaN material 14. Referring to both FIGS. 1A and 1B, in operation, the InGaN material 16 of the LED die 4 emits a blue light that stimulates the converter material 6 to emit a light (e.g., a yellow light) at a desired frequency. The combination of the blue and yellow emissions appears white to human eyes if matched appropriately.

One operational difficulty of the LED device 10 is that the LED die 4 produces a significant amount of heat. The generated heat raises the temperature of the converter material 6, and thus causes the converter material 6 to emit light at a different frequency than the desired frequency (a phenomenon commonly referred to as "thermal quenching"). As a result, the combined emissions would appear off-white and may reduce the color fidelity of electronic devices. Accordingly, several improvements in managing the thermal load in LED packages may be desirable.

DETAILED DESCRIPTION

Specific details of several embodiments of the new technology are described below with reference to LEDs and light converter materials including phosphor materials, and associated methods of manufacturing LED assemblies. The term "phosphor" generally refers to a material that emits light when irradiated by energized particles (e.g., electrons and/or photons). A person skilled in the relevant art will understand that the new technology may have additional embodiments and that the new technology may be practiced without several of the details of the embodiments described below with references to FIGS. 2-4B.

Figure 2:
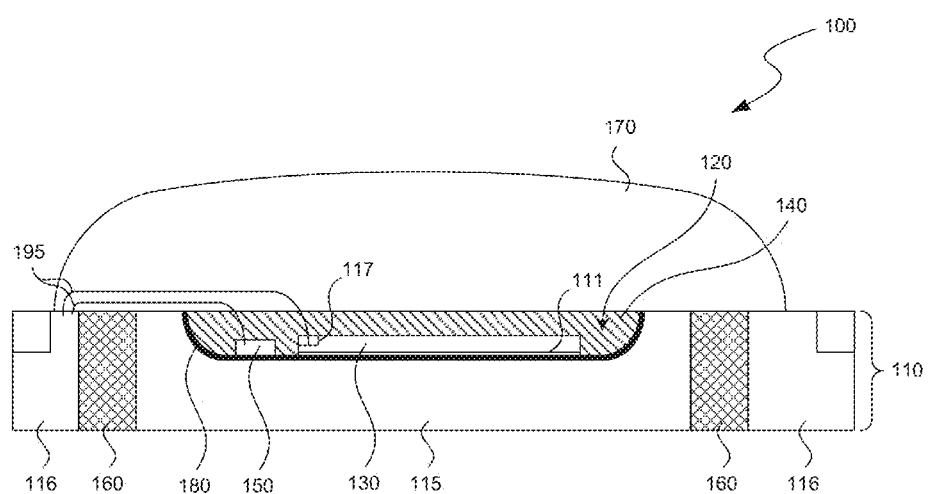
FIG. 2 is a partially schematic cross-sectional view of a microelectronic LED package in accordance with the new technology.

FIG. 2 illustrates an LED package 100 in accordance with several embodiments of the technology. The package 100 includes a conductive substrate 110 with a cavity 120, an LED 130 in the cavity 120, and a converter material 140 configured to be irradiated by the LED 130. The cavity 120 can be depression, such as a "blind cavity," that extends to an intermediate depth within the substrate 110 without passing completely through the substrate 110. The package 100 can further include an electrostatic dissipation (ESD) chip 150 and a reflective material 180 lining the cavity 120. The package 100 can also contain aa filler 160 that separates a medial, first portion 115 of the conductive substrate 110 from a lateral, second portion 116 of the substrate 110. For example, filler 160 can be a dielectric spacer between the first portion 115 and the second portion 116 that electrically isolates the first portion 115 from the second portion 116. In some embodiments, the package 100 also includes a lens 170 over the components in the cavity 120. The package 100 can include one or more LEDs 130 in a single cavity 120. In some embodiments, the cavity 120 is deeper than the thickness of the LED 130 such that the LED fits within the cavity without protruding above the surface of the substrate 110.

The conductive substrate 110 can be copper (Cu) or another suitable material that has a high thermal and electrical conductivity, such as aluminum (Al), tungsten (W), stainless steel, and/or suitable substances or alloys. The conductive substrate 110 can also provide mechanical support and rigidity for the package 100. The substrate 110 can accordingly be a heat sink with a high thermal conductivity to transfer heat from the LED 130 and/or the converter material 140.

Figure 1A:
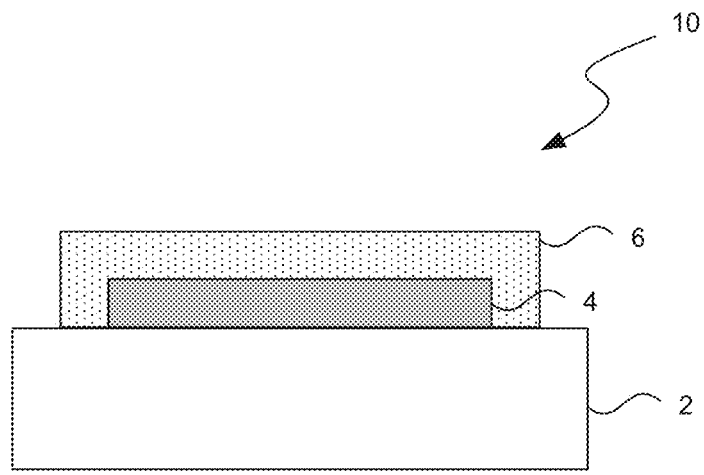
FIG. 1A is a schematic cross-sectional diagram of an LED device in accordance with the prior art.
Figure 1B:
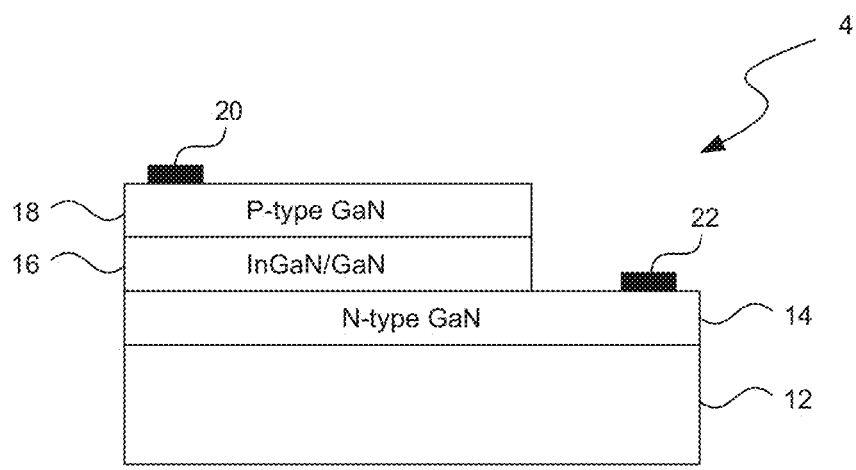
FIG. 1B is a schematic cross-sectional diagram of an LED die in accordance with the prior art.

The package 100 can include a single LED 130 or a plurality of LEDs arranged in an array. The LED 130 can be configured to emit light in the visible spectrum (e.g., from about 565 nm to about 660 nm), in the infrared spectrum (e.g., from about 680 nm to about 970 nm), in the near infrared spectrum (e.g., from about 1050 nm to about 1550 nm), and/or in other suitable spectra. In some embodiments, the LED 130 is made generally similar to the LED die 4 shown in FIG. 1B but instead of the silicon substrate 12, the LED 130 can have a metalized contact surface at the base of the LED 130 made of copper (Cu), aluminum (Al), tungsten (W), stainless steel, and/or other suitable metal and/or metal alloys, or other electrically conductive materials such as silicon carbide (SiC). The contact surface can be a first lead 111 for the LED 130. In other embodiments, the N-type GaN material 14 serves as the first lead 111.

The LED 130 can be surface mounted to the first portion 115 of the substrate 110 in the cavity 120 through the first lead 111. The LED 130 can have a second lead 117 spaced apart from the first lead 111 and connected to the second portion 116 of the substrate 110, for example, through a wirebond 195. The first lead 111 in series with the first portion 115 can be a cathodic lead, and the second lead 117 in series with the second portion 116 can be an anodic lead, or vice-versa. Surface mounting the first lead 111 to the first portion 115 largely eliminates the need for expensive, time-consuming processes required for aligning and connecting very small electrical terminals (e.g., bond-pads) between conventional LEDs and substrates. For example, the positional tolerance of a pair of contacts is related, at least in part, to the size of the contacts in the pair. Aligning two, small contacts requires accurate positioning, while aligning a small contact on a larger surface does not require the same precision. In an embodiment, the first lead 111 comprises the entire contact surface of the LED 130 to provide a large contact surface with high positional tolerance. Because the first portion 115 is electrically isolated from the second portion 116 by the filler 160, a circuit is formed between the first portion 115, the LED 130, and the second portion 116.

To achieve certain colors of light from the LED 130, a converter material 140 can be used to alter or compliment the color of light that leaves the LED 130. The converter material 140 can be placed in the cavity 120 over the LED 130 such that light from the LED 130 irradiates the phosphor in the converter material 140; the irradiated phosphor then emits light of a certain quality. Alternatively, the converter material 140 can be spaced apart from the LED 130 or in any other location that is irradiated by the LED 130. The lens 170, for example, can be infused with the converter material 140 in a single structure. For example, in one embodiment, the converter material 140 can include a phosphor containing cerium (III)-doped yttrium aluminum garnet (YAG) at a particular concentration for emitting a range of colors from green to yellow and to red under photoluminescence. In other embodiments, the converter material 140 can include neodymium-doped YAG, neodymium-chromium double-doped YAG, erbium-doped YAG, ytterbium-doped YAG, neodymium-cerium double-doped YAG, holmium-chromium-thulium triple-doped YAG, thulium-doped YAG, chromium(IV)-doped YAG, dysprosium-doped YAG, samarium-doped YAG, terbium-doped YAG, and/or other suitable phosphor compositions. The lens 170 can simply transmit the light from the LED 130 and converter material 140, or it can further focus or otherwise alter characteristics of the light.

The ESD chip 150 can prevent, mitigate, or dissipate static electricity in the LED package 100. The ESD chip 150 can be positioned in the cavity 120 or in any other convenient location.

The reflective material 180 can comprise silver, gold, or another material with generally high reflectivity and thermal conductivity. The reflective material 180 can line the cavity 120 to reflect light produced by the LED 130 through the converter material 140. The reflected light accordingly increases the output of the LED package 100 rather than being absorbed as heat. The reflective material 180 can be chosen based on its reflective qualities and for the color of light each material reflects. For example, when the surface of the substrate 110 is copper, the reflected light will have some copper colored components. A silver reflective material 180, however, also reflects light but generally without coloring the light. When a colored light is desired, the reflective material 180 can be gold or copper or another reflective, colored surface.

Figure 3A:
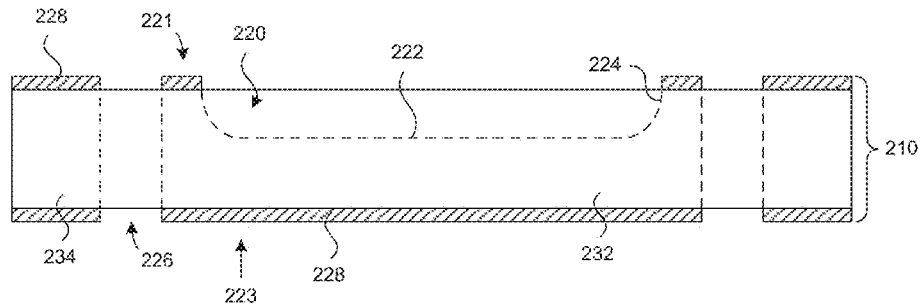
FIG. 3A is a partially schematic cross-sectional view of a manufacturing process for a microelectronic LED package in accordance with the new technology.
Figure 3B:
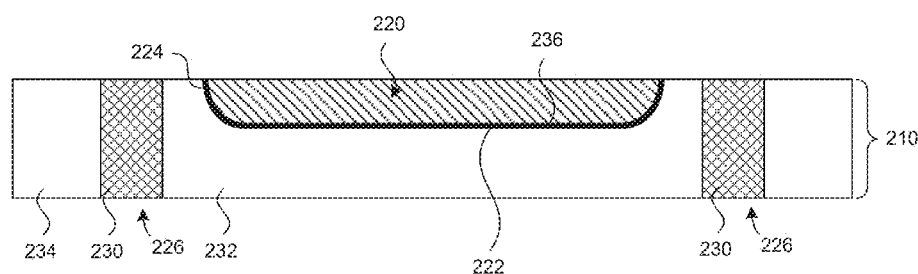
FIG. 3B is a partially schematic cross-sectional view of a manufacturing process for a microelectronic LED package in accordance with the new technology.
Figure 3C:
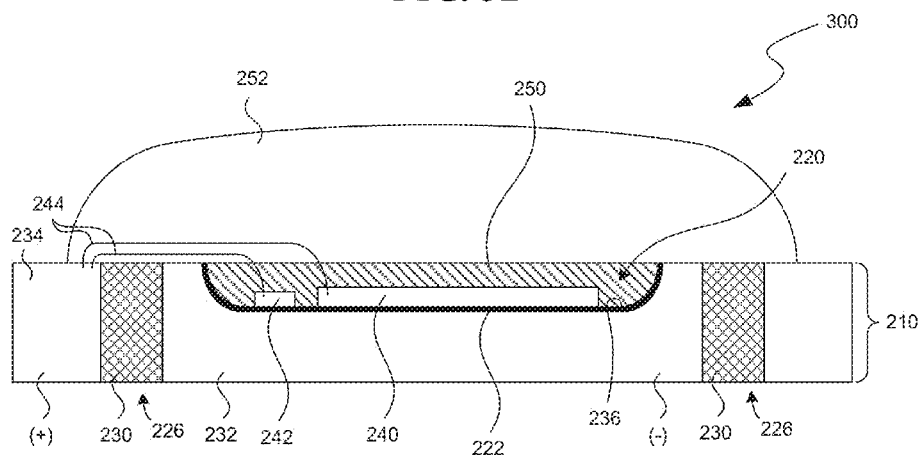
FIG. 3C is a partially schematic cross-sectional view of a manufacturing process for a microelectronic LED package in accordance with the new technology.

FIGS. 3A-3C illustrate processes for manufacturing packaged LEDs in accordance with several embodiments of the present technology. FIG. 3A depicts a substrate 210 that can begin as a single sheet of material such as copper (Cu), aluminum (Al), tungsten (W), or another suitable material. Preferably, the substrate 210 is made of an electrically and/or thermally conductive material as described above. A cavity 220 can be formed in the substrate 210 by an etching process (e.g., wet etch) or another suitable process. The cavity 220 can be a blind cavity extending into the substrate 210 leaving a bottom surface 222 and a sloped perimeter region 224 that can be rounded, angled, or vertical. The etch process can be controlled using a mask 228 covering portions of the substrate 210 that are not to be etched.

The structure shown in FIGS. 3A-3B can be made with separate top-side and bottom-side processes. For example, the cavity 220 and at least a portion of the channel 226 can be formed in the substrate 210 by a first etch process that removes material from a top-side 221. A second etch process can be performed to remove material from a bottom-side 223 of the substrate 210 at a location aligned with the location of the first etch process to complete the channel 226. The etch process can be a wet etch or another suitable process. In other embodiments, the cavity 220 and channels 226 can be created using separate and/or different processes, such as molding, pressing, grinding, and/or cutting. The processes of making the channels 226 can be used to separate a solid substrate 210 into a first portion 232 and a second portion 234.

FIG. 3B illustrates a manufacturing process according to further embodiments of the present technology in which a reflective material 236 is formed to line the cavity 222 and a filler 230 is molded in the channels 226. The reflective material 236 can be plated or formed by vapor deposition or by another, suitable method. The filler 230 can be any type of electrically insulating, moldable material to electrically isolate the first portion 232 of the substrate 210 from the second portion 234 and bond the first portion 232 and the second portion 234 together. The substrate 210 and the filler 230 form a composite structure of conductive and non-conductive materials. Additional holes and moldings can be formed into the substrate 210 depending on design considerations and to accommodate a host device.

FIG. 3C shows a subsequent portion of a manufacturing process according to several embodiments of the present technology in which an LED 240 is placed in the cavity 220 and electrically connected with the first portion 232 of the substrate 210. An ESD component 242 can also be placed in the cavity 220 or in another suitable location to mitigate damage from static electricity, similar to components explained above with respect to LED 130. As explained above, the base of the LED 240 can be electrically conductive or have a conductive contact that electrically couples the LED 240 to the first portion 232 of the substrate 210. The backside of the LED 240 can therefore be surface-mounted to the first portion 232 using a solder paste, copper bonding, or other suitable technique. The LED 240 and the ESD component 242 can also be connected to the second portion 234 through, for example, wirebonds 244 or other electrical connection means. Because the exposed surface of the substrate 210 in the cavity 220 is generally conductive, the positional tolerance for the LED 240 is relatively high and aligning the LED 240 in the cavity 220 is simple and inexpensive. Also, the conductive nature of the substrate 210 helps to dissipate heat produced by the LED 240.

A converter material 250, such as a phosphor material, can be formed in the cavity 220 or above the cavity 220. The converter material 250 can include a carrier with phosphor particles on and/or embedded in the carrier. The carrier, for example, can be a thermo-forming resin, silicone, or other suitably transparent material. The cavity 220 provides a convenient recess, or depression into which the phosphor material can be deposited in a single, easy process without having to form a separate dam on the surface of the substrate 210. Conventional phosphor structures that are built on a flat surface with no cavity generally require a first deposition process to build a dam to hold the phosphor in place, and a second process to fill the dam with the phosphor material. The cavity 220 simplifies and speeds the process by eliminating the need to construct a separate dam. The converter material 250 generally fills the cavity 220 and covers the LED 240. In other embodiments, the converter material 250 may not completely cover the LED 240. The converter material 250 can contain any type of phosphor for use with any type of LED 240 to achieve a desired light characteristic. A lens 252 can be constructed over the LED 240 to further focus or alter the light from the LED 240. The processes of FIGS. 3A-C produce a packaged LED unit 300.

Figure 4A:
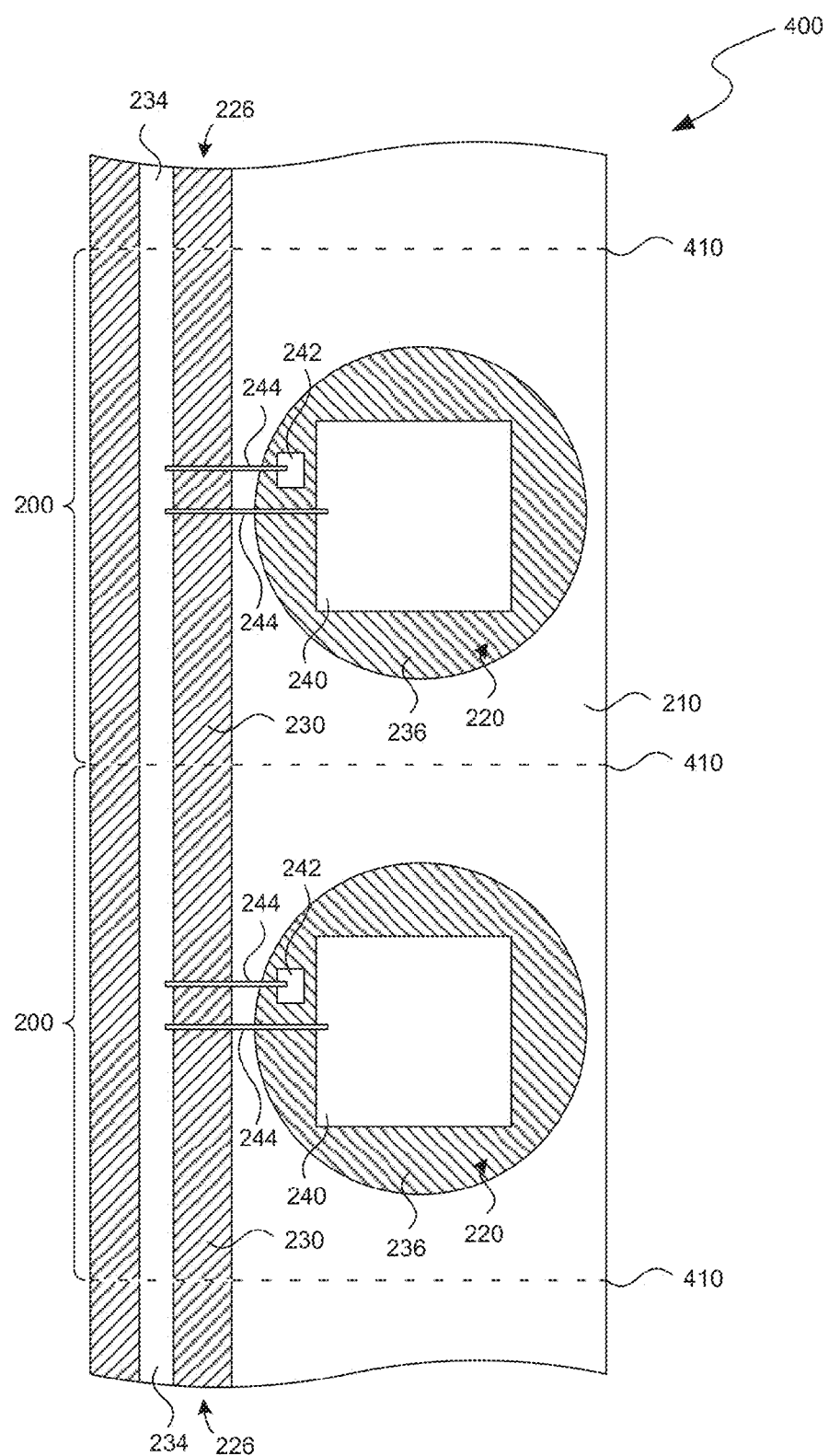
FIG. 4A is a partially schematic top view of a microelectronic device in accordance with the new technology.

FIG. 4A is a partially schematic top view of a strip 400 having a plurality of LED units 300 according to the present technology. Many features of the individual LED units 300 are substantially analogous to features described above with reference to FIGS. 2 and 3A-3C, and can be made using similar manufacturing techniques. Like reference numbers accordingly correspond to like elements in FIGS. 2-4A. The strip 400 includes the substrate 210, such as a copper substrate, a depression 220 for each LED unit 300, and the channel 226 defined by an elongated trench near the depression 220. The channel 226 can be filled with a molded filler 230 or other suitable electrical insulator. Each LED unit 300 has at least one LED 240 and an ESD chip 242 placed in the depression 220. The substrate 210 can be cut along lines 410 to separate the individual LED units 300 from each other, or the substrate 210 can remain intact such that a single device can have multiple individually packaged LED units 300. The structures and processes described here can be applied in batch to many, similar packages in the strip or wafer.

Figure 4B:
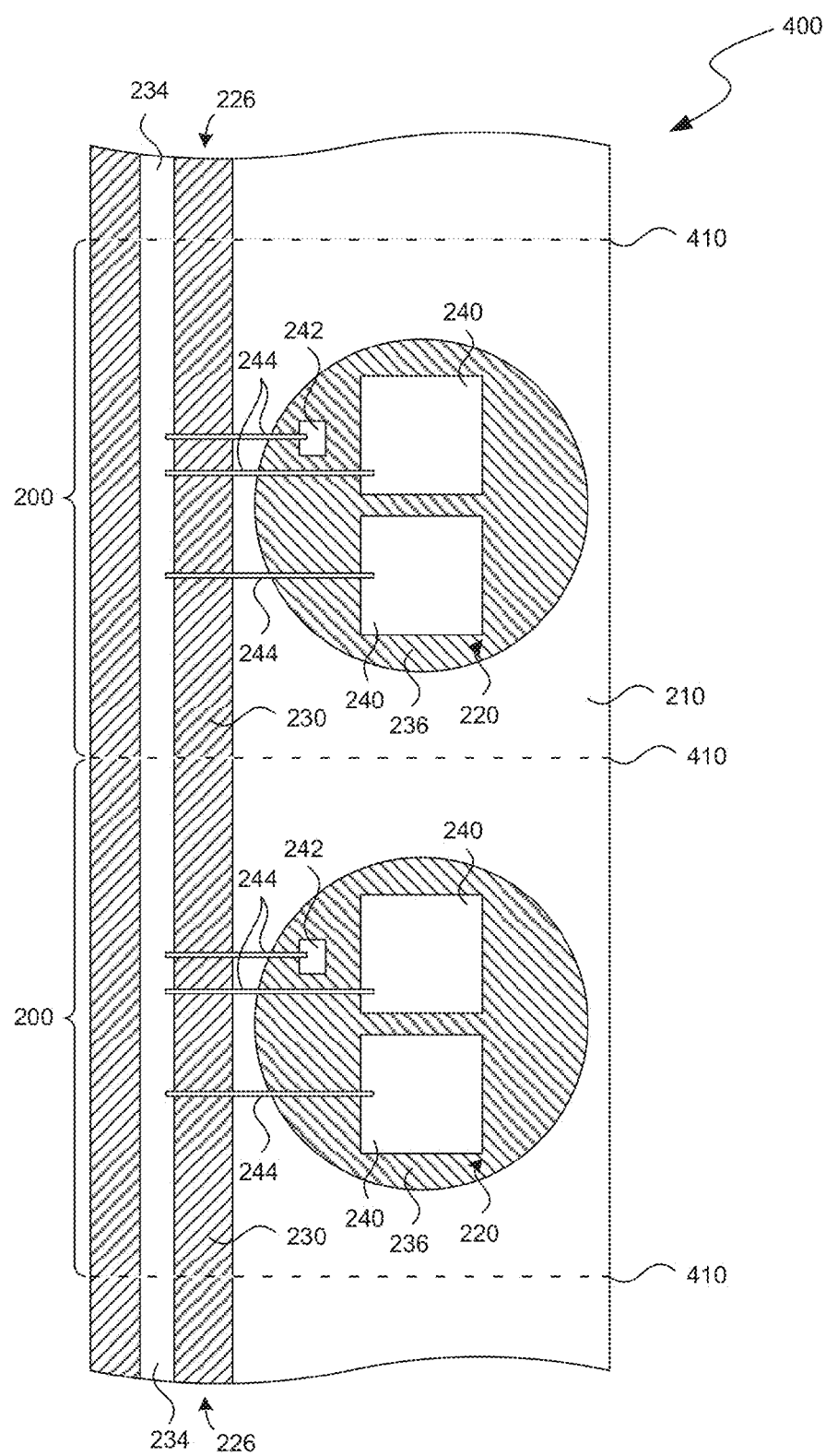
FIG. 4B is a partially schematic top view of a microelectronic device in accordance with the new technology.

FIG. 4B illustrates an alternative embodiment of the LED package 200 in accordance with the present technology. Features of the package 200 are generally similar to features of FIG. 4A. The package 200 can have a substrate 210 with a depression 220 that contains multiple LEDs 240 in the depression 220. Any suitable number of LEDs 240 can be included in the depression 220. The LEDs 240 may have different characteristics and may emit light of different frequencies, and the converter material and lens (not shown) can be adjusted as necessary to accommodate the multiple LEDs 240, including using multiple types of converter materials. Alternatively, the LEDs 240 can be similarly configured. The depression 220 for embodiments including plural LEDs 240 can be larger than the depression 220 in other embodiments. In other embodiments, the depression 220 can be of a uniform size large enough to accommodate a given number of LEDs 240 (e.g., four or five). The uniform size allows the package 200 to include up to the given number of LEDs 240 without requiring a different substrate 210 or reconfiguring any process steps.

From the foregoing, it will be appreciated that specific embodiments of the invention have been described herein for purposes of illustration, but well-known structures and functions have not been shown or described in detail to avoid unnecessarily obscuring the description of the embodiments of the invention. Where the context permits, singular or plural terms may also include the plural or singular term, respectively. Unless the word "or" is associated with an express clause indicating that the word should be limited to mean only a single item exclusive from the other items in reference to a list of two or more items, then the use of "or" in such a list shall be interpreted as including (a) any single item in the list, (b) all of the items in the list, or (c) any combination of the items in the list.

Also, it will be appreciated that specific embodiments described above are for purposes of illustration and that various modifications may be made without deviating from the invention. Aspects of the disclosure described in the context of particular embodiments may be combined or eliminated in other embodiments. Further, while advantages associated with certain embodiments of the disclosure may have been described in the context of those embodiments, other embodiments may also exhibit such advantages, but not all embodiments need necessarily exhibit such advantages to fall within the scope of the disclosure. Accordingly, the present invention is not limited to the embodiments described above, which were provided for ease of understanding; rather, the invention includes any and all other embodiments defined by the claims.

I claim:

1. A method for forming a packaged light emitting diode (LED), the method comprising:
    forming a cavity in a first portion of a substrate;
    separating the first portion of the substrate from a second portion of the substrate by forming a channel therebetween;
    forming a filler in the channel such that the first portion is electrically isolated from the second portion;
    placing an LED in the cavity;
    electrically connecting the LED between the first and second portion of the substrate;
    forming a phosphor material over the LED in the cavity; and
    forming a lens, wherein the lens is formed directly on both an outer surface of the substrate and an outer surface of the phosphor material.

2. The method of claim 1, further comprising:
    placing an electrostatic dissipation (ESD) chip in the cavity; and
    electrically connecting the ESD chip and the substrate.

3. The method of claim 1 wherein the substrate comprises a metal substrate.

4. The method of claim 1, further comprising forming a reflective material on an interior region of the cavity.

5. The method of claim 4 wherein the reflective material comprises silver or gold.

6. The method of claim 1 wherein forming the cavity comprises forming a blind cavity with a bottom surface and a sloped surface surrounding the bottom surface.

7. The method of claim 6 wherein the sloped surface comprises a surface inclined at an angle.

8. The method of claim 6 wherein the sloped surface comprises a curved surface.

9. The method of claim 1 wherein the first portion comprises a cathodic lead and the second portion comprises an anodic lead.

10. The method of claim 1 wherein placing the LED in the cavity comprises placing a plurality of LEDs in the cavity.

11. The method of claim 1 wherein forming the cavity comprises etching the material from the substrate.

12. The method of claim 1, further comprising electrically coupling a base portion of the LED to a bottom surface of the cavity.

13. The method of claim 12 wherein the bottom surface is coated with a reflective material, and wherein the base portion of the LED is electrically coupled to the first portion of the substrate through the reflective material.

14. The method of claim 1 wherein the substrate comprises a copper substrate.

15. The method of claim 1 wherein electrically connecting the LED includes forming a wire bond between the LED and the second portion of the substrate, wherein the wirebond extends at least partially into a portion of the lens.

16. The method of claim 1 wherein the outer surfaces of the substrate and the phosphor material are flat surfaces.

17. The method of claim 1 wherein the outer surfaces of the substrate and the phosphor material are coplanar.

18. The method of claim 1, further comprising forming a reflective material on an interior region of the cavity, wherein a portion of the lens is adjacent the reflective material.

19. A method for forming a packaged light emitting diode (LED), the method comprising:
   forming a cavity in a first portion of a substrate;
   separating the first portion of the substrate from a second portion of the substrate by forming a channel therebetween, wherein forming the channel comprises a first etch that removes material from one side of the substrate to an intermediate depth within the substrate and a second etch that removes material from an opposite side of the substrate in alignment with the first etch;
   forming a filler in the channel such that the first portion is electrically isolated from the second portion;
   placing an LED in the cavity;
   electrically connecting the LED between the first and second portion of the substrate; and
   forming a phosphor material over the LED in the cavity.

* * * * *